(12) United States Patent
Iwasaki

(10) Patent No.: US 8,766,299 B2
(45) Date of Patent: Jul. 1, 2014

(54) ELECTRO-OPTICAL DEVICE AND ELECTRONIC APPARATUS COMPRISING ELECTRO-OPTICAL DEVICE HAVING COLOR FILTER AND SEALING FILM

(75) Inventor: Masanori Iwasaki, Shiojiri (JP)

(73) Assignee: Seiko Epson Corporation, Tokyo (JP)

( * ) Notice: Subject to any disclaimer, the term of this patent is extended or adjusted under 35 U.S.C. 154(b) by 7 days.

(21) Appl. No.: 13/108,459

(22) Filed: May 16, 2011

(65) Prior Publication Data

US 2011/0284898 A1    Nov. 24, 2011

(30) Foreign Application Priority Data

May 21, 2010   (JP) ................................. 2010-117043

(51) Int. Cl.
  *H01L 33/00*   (2010.01)
  *H01L 29/20*   (2006.01)
  *H01J 1/62*   (2006.01)
  *H01J 63/04*   (2006.01)

(52) U.S. Cl.
  USPC ........ 257/98; 257/89; 257/E33.055; 313/504; 313/512

(58) Field of Classification Search
  None
  See application file for complete search history.

(56) References Cited

U.S. PATENT DOCUMENTS

| 5,907,377 A | 5/1999 | Nishida et al. |
| 2005/0146266 A1 | 7/2005 | Kuma et al. |
| 2006/0012288 A1 | 1/2006 | Terakado et al. |
| 2007/0077349 A1 | 4/2007 | Newman et al. |
| 2007/0145887 A1* | 6/2007 | Chae et al. ..................... 313/504 |
| 2010/0059754 A1* | 3/2010 | Lee et al. ......................... 257/59 |
| 2011/0175118 A1* | 7/2011 | Hori et al. ........................ 257/89 |

FOREIGN PATENT DOCUMENTS

| JP | A-4-355406 | 12/1992 |
| JP | A-8-146214 | 6/1996 |
| JP | A-2005-63785 | 3/2005 |
| JP | A-2006-32010 | 2/2006 |
| JP | A-2006-332019 | 12/2006 |
| JP | A-2006-337389 | 12/2006 |
| JP | A-2009-510696 | 3/2009 |
| JP | A-2009-146734 | 7/2009 |
| WO | WO 03/069957 A1 | 8/2003 |
| WO | WO 2007/041116 A1 | 4/2007 |
| WO | WO2010035678 A1 * | 4/2010 ............... G02B 5/08 |

OTHER PUBLICATIONS

Meaning of plan view, dictionary.com (2013), p. 2 of 4. Retrieved Mar. 16, 2013 from http://dictionary.reference.com/browse/plan.*

* cited by examiner

*Primary Examiner* — Michael Jung

(74) *Attorney, Agent, or Firm* — Oliff PLC

(57) ABSTRACT

An electro-optic device includes a light-emitting element disposed above a substrate, an optically transparent sealing film covering the light-emitting element, and a color filter disposed on the sealing film so as to adjoin the sealing film. The sealing film includes a thin portion overlapping at least part of the light-emitting element, and a thick portion surrounding the thin portion. The thin portion and the thick portion form a recess in the sealing film. The color filter fills the recess.

15 Claims, 7 Drawing Sheets

ELECTRO-OPTICAL DEVICE AND ELECTRONIC APPARATUS COMPRISING ELECTRO-OPTICAL DEVICE HAVING COLOR FILTER AND SEALING FILM

BACKGROUND

1. Technical Field

The present invention relates to an electro-optic device and a method for manufacturing the same, and to an electronic apparatus.

2. Related Art

As information apparatuses are diversifying, the demand for electro-optic devices capable of displaying images on a plane is increasing. Organic EL devices have been known as a type of electro-optic device, and which display images using light emitted by applying a current to an organic EL (electroluminescence) layer. In order that an organic EL device displays color images, a color filter may be used which transmits light rays having wavelengths in a specific range.

For example, JP-A-2009-146734 discloses an organic EL device that includes a first substrate including organic EL elements, and a second substrate having color filters. The organic EL element includes a pair of electrodes and an organic EL layer between the electrodes, and the first and the second substrate are bonded together. Also, JP-A-2006-32010 discloses a structure in which color filters are disposed over the respective organic EL elements.

In the organic EL device of JP-A-2009-146734, the bonding of the substrates is likely to cause misalignment to an extent. This misalignment can lead to the degradation of the quality of displayed images. The smaller the area of the organic EL elements, the more the image quality is affected by the misalignment. Accordingly, it is difficult to miniaturize the organic EL element, or to increase the definition of the organic EL device.

In the organic EL device having the structure disclosed in JP-A-2006-32010, a partition member separating the color filters from each other is flattened by the overlying organic EL layer. Accordingly, it is difficult to form color filters having sufficient thickness, and is therefore difficult to enhance the color purity.

SUMMARY

Accordingly, the present invention has been made in order to solve at least part of the above issue, and the following embodiments of the invention can be achieved.

According to an aspect of the invention, an electro-optic device is provided which includes a light-emitting element disposed above a substrate, an optically transparent sealing film covering the light-emitting element, and a color filter disposed on the sealing film so as to adjoin the sealing film. The sealing film includes a thin portion overlapping at least part of the light-emitting element, and a thick portion surrounding the thin portion. The thin portion and the thick portion form a recess in the sealing film. The color filter fills the recess.

In the electro-optic device having such a structure, the misalignment of the color filter can be reduced. Thus, the electro-optic device can be miniaturized, and the quality of displayed images can be increased.

The sealing film may be made of an inorganic material.

The electro-optic device having such a structure can be considerably miniaturized and the quality of displayed images can be highly increased.

The inorganic material may be a silicon compound.

Silicon compounds have high sealing ability. By use of a silicon compound for the sealing film, a high-definition low-profile electro-optic device can be achieved.

The electro-optic device may further include a light-shielding film disposed on the thick portion.

In the electro-optic device having such a structure, color mixing among the light-emitting elements can be reduced. Thus, the electro-optic device can be miniaturized, and the quality of displayed images can be increased.

The light-shielding film may be made of Cr or Ni.

Since Cr and Ni can block light, color mixing can be further reduced to enhance the quality of displayed images.

The light-shielding film may have a thickness smaller than the depth of the recess.

Thus the step height between the upper surface of the color filter formed in the recess and the light-shielding film can be reduced. Consequently, the adhesion of the overlying layers or members can be enhanced.

The thin portion may have a smaller thickness than the thick portion.

Thus the step height can be reduced even if the color filter is disposed only over the light-emitting element. In addition, the alignment of the light-emitting element and the color filter can be facilitated. Accordingly, the reliability and productivity of the electro-optic device can be enhanced.

The light-emitting element may include a first electrode, a second electrode, and a luminescent layer emitting white light between the first electrode and the second electrode.

Consequently, all the light-emitting elements have the same structure, and accordingly the structure of the electro-optic device can simplified and the manufacturing cost can be reduced.

The color filter may transmit any one of red light, green light and blue light.

By use of color filters having such a function in combination with the luminescent layers emitting white light, three primary color lights can be produced. Thus, the electro-optic device can display color images and can be manufactured at a low cost.

According to another aspect of the invention, an electronic apparatus including the electro-optic device is provided.

The electronic apparatus can have a display portion that can display high-quality images, and its size and weight are not increased.

According to still another aspect of the invention, a method is provided for manufacturing an electro-optic device. The method includes forming a light-emitting element on a substrate, forming an inorganic material layer so as to cover the light-emitting element, forming a recess in a first region of the inorganic material layer by etching the region of the inorganic material layer overlying the light-emitting element, and forming a color filter in the recess.

In this method, the light-emitting element and the color filter can be formed on the same substrate. Accordingly, the misalignment between the light-emitting element and the color filter can be reduced, and the resulting electro-optic device can display more high-quality images.

In the above method, the inorganic material layer may be formed of a silicon compound, and the forming of the recess may be performed by dry etching the silicon compound layer.

Since dry etching allows anisotropic etching, recesses can be closely formed with a sufficient depth by etching the silicon compound layer. Thus, the method can produce a high-definition electro-optic device with the misalignment reduced.

The method may further include forming a light-shielding layer between the forming of the inorganic material layer and the forming of the recess. The forming of the recess includes removing the light-shielding layer before etching the silicon compound layer.

Consequently, the resulting recess has a side wall part of which can function as a light-shielding film. Thus, the method can produce an electro-optic device that can display still more high-quality images with color mixing reduced between the light-emitting elements.

The light-emitting element may emit white light, and the color filter transmits any one of red light, green light and blue light.

Thus the displaying of color images can be achieved only by adding an operation for forming color filters. Accordingly, an electro-optic device capable of displaying more high-quality images can be manufactured at a lower cost.

BRIEF DESCRIPTION OF THE DRAWINGS

The invention will be described with reference to the accompanying drawings, wherein like numbers reference like elements.

DESCRIPTION OF EXEMPLARY EMBODIMENTS

Figure 1:
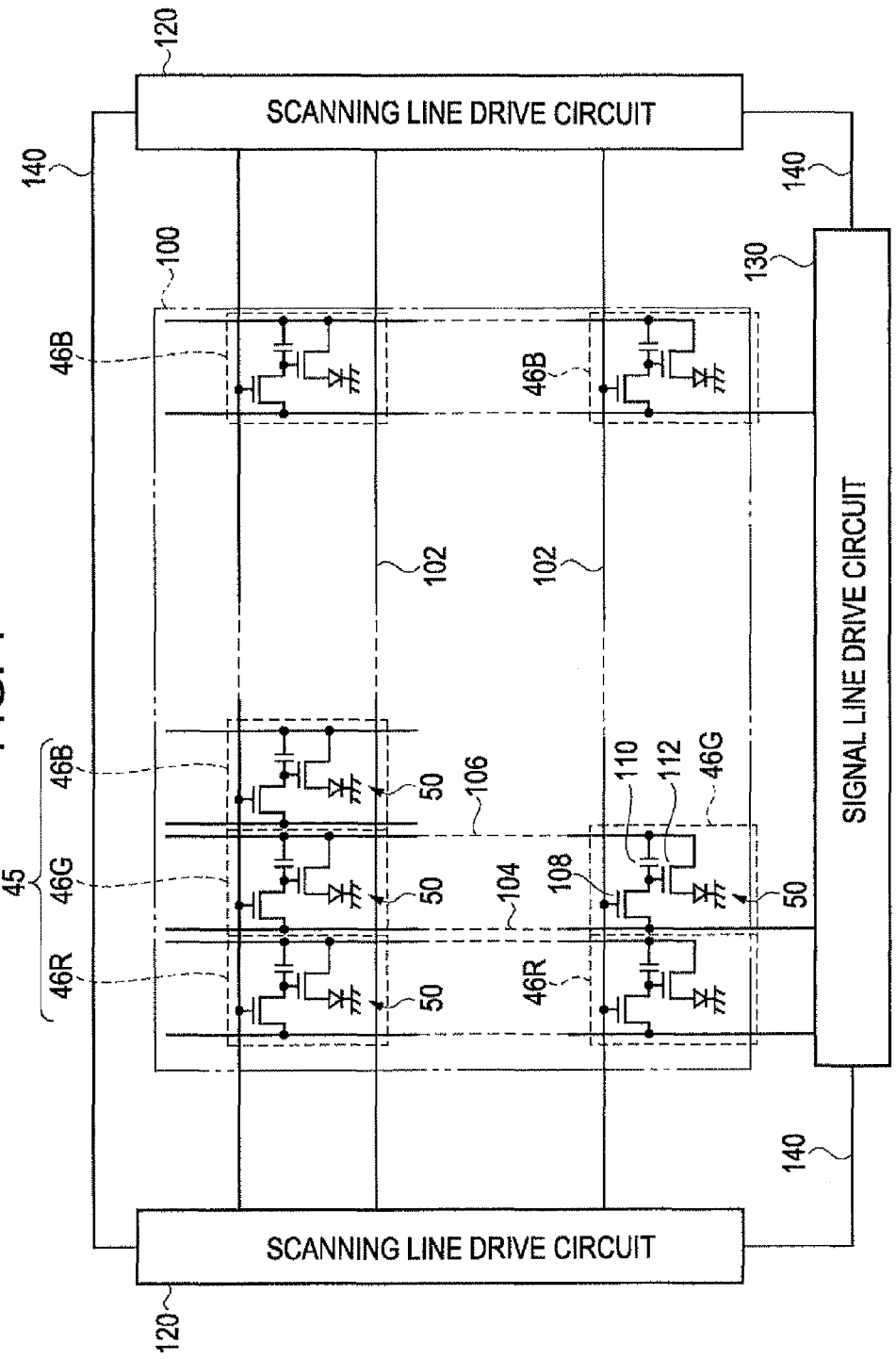
FIG. 1 is a circuit diagram of an organic EL device according to a first embodiment of the invention.

Exemplary embodiments of the invention will now be described. In the organic EL devices disclosed as a type the electro-optic device of the invention in the following embodiments, organic EL elements are arranged as light-emitting elements in an image display region. For the sake of visibility, the dimensional proportions of the parts and members in the drawings may differ as needed.

First Embodiment

FIG. 1 is a circuit diagram of an organic EL device 1 according to a first embodiment of the invention. The organic EL device 2 according to a second embodiment of the invention has the same circuit configuration as that shown in FIG. 1. The organic EL device 1 is of an active matrix type forming color images in an image display region 100 by controlling the emission of each of organic EL elements. The image display region 100 includes a plurality of scanning lines 102, a plurality of signal lines 104 orthogonal to the scanning lines 102, and a plurality of power supply lines 106 parallel to the signal lines 104. Sub-pixels 46 are provided in the respective divisions defined by being surrounded by the three lines.

The sub-pixels 46 include red sub-pixels 46R emitting red light, green sub-pixels 46G emitting green light, and blue sub-pixels 46B emitting blue light. Each set of the three sub-pixels 46R, 46G and 46B defines a pixel 45. The color of emitted light depends on the color filter 90 described below with reference to FIG. 3, and the same organic EL elements 50 are disposed in the sub-pixels 46R, 46G and 46B. In the following description, the sub-pixels pixel 46R, 46G and 46B may be collectively referred to as the sub-pixel(s) 46. Similar expressions apply to the color filters 90 and the below-described sub-pixel regions 42 (see FIG. 2).

Each sub-pixel 46 region includes a switching TFT (thin film transistor) 108 having a gate electrode to which scanning signals are transmitted through the scanning line 102; a hold capacitor 110 holding an image signal transmitted from the signal line 104 through the switching TFT 108; a driving TFT 112 having a gate electrode to which the image signal held in the hold capacitor 110 is transmitted; and the organic EL element 50 to which a driving current flows from the power supply line 106 through the driving TFT 112.

Figure 3:
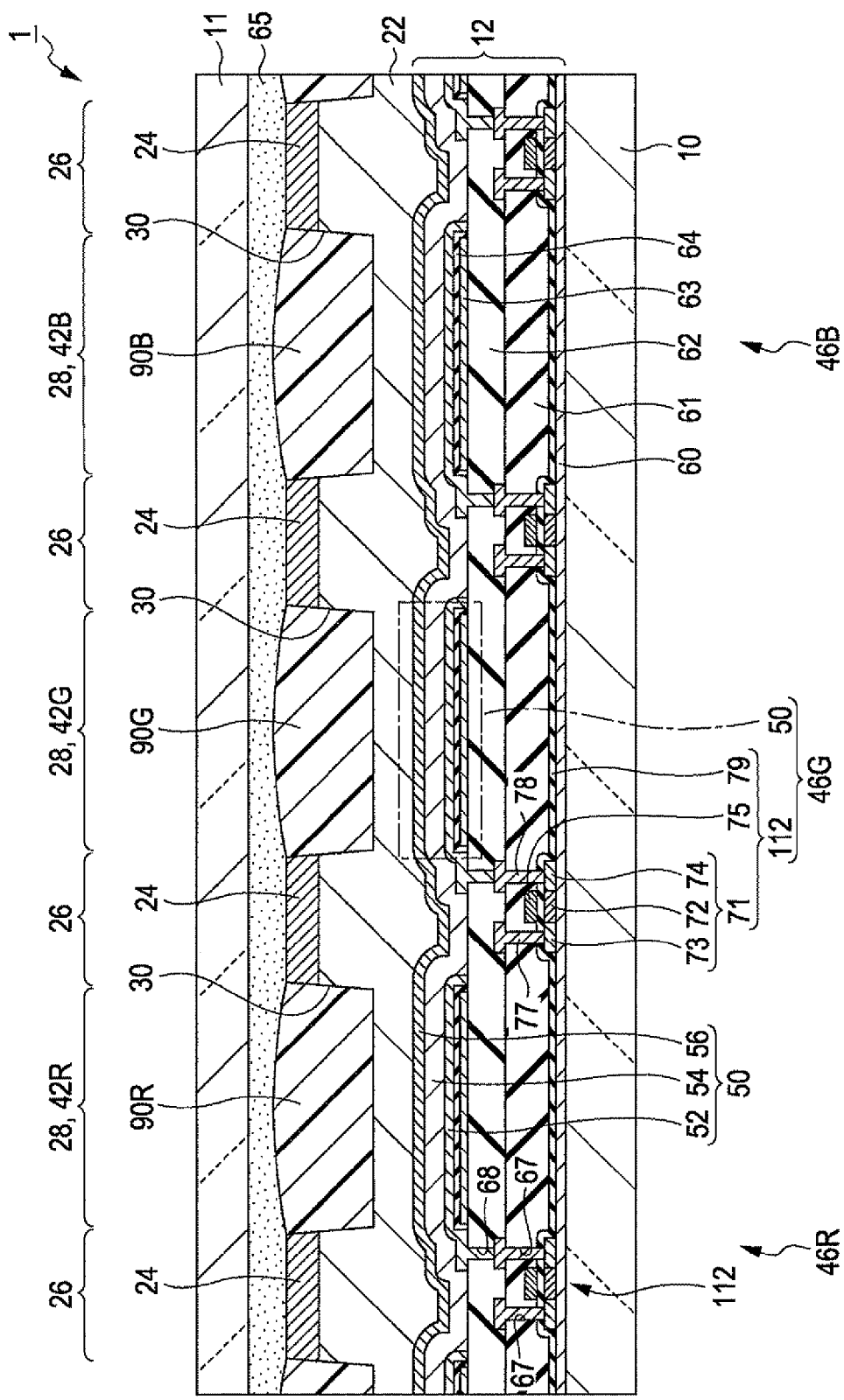
FIG. 3 is a schematic sectional view of the organic EL device of the first embodiment.

As shown in FIG. 3, the organic EL element 50 includes a first electrode or a pixel electrode (anode) 52, a second electrode or a cathode 56 disposed throughout the image display region 100, and a light-emitting function layer 54 including an organic EL layer. The elements including the switching TFTs 108 are formed by a high-temperature process.

Scanning line drive circuits 120 and a signal line drive circuit 130 are disposed around the image display region 100. The scanning line drive circuits 120 supply scanning signals to the scanning lines 102 one after another according to the signal transmitted from an external circuit (not shown). The signal line drive circuit 130 supplies an image signal to the signal lines 104. The power supply lines 106 transmit a pixel driving current from an external circuit (not shown). The operation of the scanning line drive circuits 120 and the operation of the signal line drive circuit 130 are synchronized by a synchronization signal transmitted through a synchronization signal line 140 from an external circuit.

On bringing the switching TFT 108 into an ON state by driving the scanning line 102, the hold capacitor 110 holds the potential of the signal line 104 at this time, and the level of the driving TFT 112 is determined according to the state of the hold capacitor 110. Then, the power supply line 106 transmits a driving current to the pixel electrode 52 through the driving TFT 112, and further to the cathode 56 through the light-emitting function layer 54. The light-emitting function layer 54 emits light according to the magnitude of the driving current. Consequently, each organic EL element 50 including the light-emitting function layer 54 and each sub-pixel 46 including the organic EL element 50 emit light according to the magnitude of the driving current.

As described above, the pixel 45 includes three sub-pixels 46R, 46G and 46B that emit any one of red light, green light or blue light. Thus, the pixel 45 can emit light having a desired wavelength produced by mixing three primary color lights at a desired intensity. A color image is thus formed in the image display region 100 in which the pixels 45 are regularly arranged.

Figure 2:
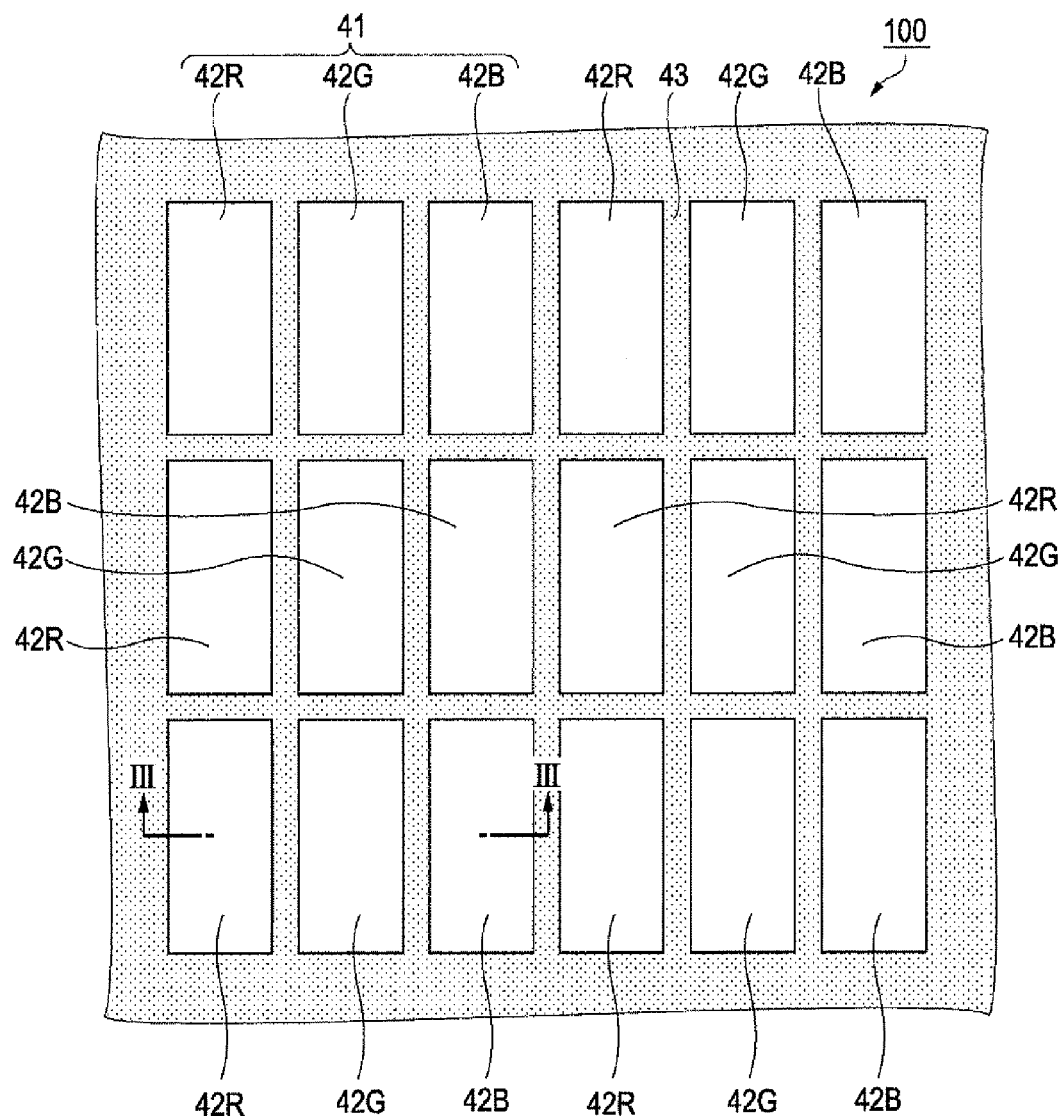
FIG. 2 is a diagram of the arrangement of pixel regions in the organic EL device of the first embodiment.

FIG. 2 shows the arrangement of pixel regions 41 in the organic EL device 1 according to the present embodiment and the organic EL device 2 according to a second embodiment. As shown in FIG. 2, the pixel regions 41 are regularly arranged in the image display region 100. Each pixel region 41 includes three sub-pixel regions 42: a red sub-pixel region 42R from which red light is emitted; a green sub-pixel region 42G from which green light is emitted; and a blue sub-pixel region 42B from which blue light is emitted.

The pixels 45 and the sub-pixels 46 refer to a functional concept, and the pixel regions 41 and the sub-pixel regions 42 refer to a locational concept. More specifically, the sub-pixel 46 and the sub-pixel region 42 have a one-to-one correspondence, and the pixel region 41 is a minimum unit region from which light having a desired wavelength, that is, desired color light, can be emitted. A light-shielding region 43 not emitting light lies between each sub-pixel region 42. Since the sub-pixel regions 42 of the organic EL device 1 are arranged in a matrix manner, the light-shielding region 43 is formed in a grid manner.

The sub-pixel region 42 is provided with a color filter 90, and the light-shielding region 43 is provided with a light-shielding film 24, as shown in FIG. 3. The sub-pixel region 42 measures about 14 μm by about 4 μm, and each strip of the grid of the light-shielding region 43 has a width of about 1 μm. Hence, the pixel region 41 measures about 15 μm by about 15 μm in terms of center-to-center length.

In the organic EL device 1 of the present embodiment, each driving TFT 112 that drives the corresponding organic EL element 50 is formed by a high-temperature poly-process in which the below-described semiconductor layer 71 (see FIG. 3) is formed by a high-temperature process. Thus, the size and area of the driving TFT 112 and other transistors or the like are reduced. Therefore, the switching TFT 108, hold capacitor 110 and driving TFT 112 of the sub-pixel 46 can be formed in the sub-pixel region 42 having an area as small as about 14 μm by about 4 μm. Since the area of the sub-pixel 46 is reduced, many pixels 45 can be closely arranged at a high density in the image display region 100. Accordingly, the organic EL device 1 can display high-definition images.

In the organic EL device 1, the color filters 90, which are components of the respective pixels 45, are provided on the same substrate with the organic EL elements 50, so that the misalignment between the color filters 90 and the organic EL elements 50 can be reduced. Consequently, the organic EL device can display high-definition, high-quality images. The arrangement of the organic EL elements 50 and the color filters 90 will now be described with reference to the sectional view shown in FIG. 3.

FIG. 3 is a schematic sectional view of the organic EL device 1 taken along line III-III in FIG. 2. FIG. 3 shows three sub-pixels 46R, 46G and 46B of one of the pixels 45. The switching TFTs 108 and the hold capacitors 110 are not shown in the Figure. The structure of the organic EL device 1 will now be described from the substrate 10.

The substrate 10 is made of quartz glass, and the surface of the substrate 10 is coated with a base protection layer 60 made of a silicon compound such as $SiO_n$. The organic EL device 1 of the present embodiment is of a top emission type that emits light from the opposite side from the substrate 10. Hence, the substrate 10 is not required to be transparent. However, the substrate 10 functions as the base for forming the driving TFTs 112 and other transistors or the like by a high-temperature process, as described above. Accordingly, it is required that the substrate be resistant to high temperatures up to about 1000° C., and that the substrate do not separate out impurities when it is heated. From these viewpoints, the substrate 10 is made of quartz glass.

Driving TFTs 112 are regularly formed on the surface of the protective substrate 11 side of the substrate 10. In the following description, the protective substrate 11 side refers to the upper side of the organic EL device. Each driving TFT 112 includes a polysilicon (polycrystalline silicon) semiconductor layer 71, a gate insulating layer 79 and a gate electrode 75. The polysilicon of the semiconductor layer 71 is produced by a high-temperature process, as mentioned above, and has high electron mobility. The gate electrode 75 is made of, for example, Al (aluminum), and is formed by patterning the same layer as the scanning lines 102. The gate insulating layer 79 is formed of $SiO_n$ (silicon oxide), $SiN_n$ (silicon nitride) or $SiO_mN_n$ (silicon oxynitride) over the entire surface of the image display region 100.

The semiconductor layer 71 includes a channel region 72 opposing the gate electrode 75, and a source region 73 and a drain region 74 disposed at both sides of the channel region 72. A first insulating interlayer 61 is formed over the driving TFTs 112. The first insulating interlayer 61 may be formed of an inorganic material such as a silicon compound, an organic material such as acrylic resin, or a composite including an inorganic material layer and an organic material layer. In the present embodiment, the first insulating interlayer 61 is made of a silicon compound $SiO_n$.

First contact holes 67 are formed in the first insulating interlayer 61 corresponding to the source regions 73 and the drain regions 74 by selectively removing the first insulating interlayer. In the first contact holes 67, a source electrode 77 or a drain electrode 78 is embedded.

A second insulating interlayer 62 is formed over the source electrodes 77 and the drain electrodes 78. The second insulating interlayer 62 is preferably made of an inorganic material from the viewpoint of sealing. In the present embodiment, the second insulating interlayer 62 is made of the same $SiO_n$ as the first insulating interlayer 61.

Second contact holes 68 are formed over the drain electrodes 78 by selectively removing the second insulating interlayer 62. A reflection layer 63 is disposed on the second insulating interlayer 62 except the regions where the second contact holes are formed and their small surroundings. First electrodes or pixel electrodes 52 are formed to cover the reflection layer 63 with protective films 64 therebetween.

The pixel electrodes 52 are made of a transparent material, such as indium tin oxide (ITO), and each is connected to the drain electrode 78 through the corresponding second contact hole 68. Thus, the pixel electrode 52 is electrically connected to the driving TFT 112 so that a driving current is supplied from the power supply line 106 to the light-emitting function layer 54. The reflection layer 63 is made of Al and the protective film 64 is made of $SiO_n$. The protective film 64 may be made of $SiN_n$ (silicon nitride) or $SiO_mN_n$ (silicon oxynitride). The reflection layers 63 are disposed with spaces therebetween in the respective sub-pixel regions 42. Therefore the second contact hole 68 is preferably formed in the light-shielding region 43 when viewed from above.

The transistors, capacitors and other elements formed to the substrate side of the reflection layer 63 do not interfere with displaying images. Therefore, although the driving TFT 112 does not overlap with the reflection layer 63 in the structure shown in FIG. 3, they may overlap with each other. The same applies to other elements such as the hold capacitor 110.

A light-emitting function layer 54 and a second electrode or cathode 56 are disposed over the pixel electrodes 52 throughout the image display region 100. Each organic EL element 50 includes the pixel electrode 52, the light-emitting function layer 54 and the cathode 56. In other words, the organic EL element 50 is defined by a multilayer composite including the pixel electrode 52, the light-emitting function layer 54 and the cathode 56. In FIG. 3, however, the organic EL element 50 is designated by the portion surrounded by a dotted chain line, including the reflection layer 63 and the protective film 64. In the following description, the portion from the upper surface of the substrate 10 to the cathode 56 of the organic EL elements 50 is referred to as an element layer 12.

The cathode 56 has an identical potential in the entire image display region 100, and is electrically connected to a cathode line (not shown) on the substrate 10 outside the image display region. The cathode 56 has a multilayer structure including an electron injection buffer layer (no reference numeral) and a transparent electroconductive layer (no reference numeral), and emits light produced in the light-emitting function layer 54 through the below-described protective substrate 11.

The electron injection buffer layer is made of, for example, LiF (lithium fluoride) or Ca (calcium). The transparent electroconductive layer is made of ITO or a metal thin film, such as that of Al or AgMg (silver-magnesium alloy). In order to ensure a transparency, the transparent electroconductive layer is formed to a small thickness, and accordingly its surface resistance tends to increase. Accordingly, auxiliary electrodes may be formed in a grid manner under the light-shielding films 24 so that the surface resistance can be reduced without impairing the transparency in the sub-pixel regions 42.

The light-emitting function layer 54 has five-layer structure including a hole injection layer facilitating the injection of holes from the pixel electrode 52, a hole transport layer facilitating the transport of the injected holes to a luminescent layer, an organic EL layer or the luminescent layer that emits light by electrification, that is, by combining holes and electrons, an electron transport layer facilitating the transport to the organic EL layer of electrons injected from the cathode 56, and an electron injection layer facilitating the injection of electrons from the cathode 56, in that order from below.

The organic EL layer, from which white light is emitted by combining holes and electrons, is made of a low-molecular-weight organic EL material or a macromolecular organic EL material. The same organic EL elements 50 are provided in the sub-pixels 46R, 46G and 46B. Hence, three primary color lights from the organic EL device 1 are produced through respective color filters 90. Each sub-pixel 46 includes the organic EL element 50, the driving TFT 112 and other transistors or the like disposed on the substrate 10, and a color filter 90 that will be described below.

A sealing film 22 including thick portions 26 and thin portions 28 is disposed over the organic EL elements 50. The sealing film 22 is intended to prevent the penetration of external air or the like from above, and is accordingly required to be hermetic. Preferably, the sealing film 22 is made of an inorganic material. In the present embodiment, the sealing film 22 is made of a silicon compound, specifically $SiO_n$. $SiN_n$ or $SiO_mN_n$ may be used.

The thin portions 28 of the sealing film 22 are located in the regions to which the respective organic EL elements 50 emit light, and hence substantially correspond to the sub-pixel regions 42 (see FIG. 2) when viewed from above. The thick portions 26 substantially correspond to the light-shielding region 43 when viewed from above. Thus, the thin portions 28 are surrounded by the thick portions 26 so as to form recesses 30, each defined by the thin portion 28 acting as the bottom and the thick portions 26 acting as the side walls. The color filters 90 are disposed in the respective recesses 30 so as to fill the recesses 30.

The light-shielding film 24 is formed on the thick portions 26. The light-shielding film 24 is provided to reduce the phenomenon of light emission from adjacent sub-pixels 46, that is, to reduce color mixing. Accordingly, the light-shielding film 24 is made of a light-shielding material such as Cr (chromium) or Ni (nickel). Since the light-shielding film 24 overlies the thick portions 26, the depth of the recesses 30 is defined by the sum of the thickness of the thick portion 26 of the sealing film 22 and the thickness of the light-shielding film 24.

The thin portions 28 have a thickness sufficient to suppress the penetration of external air or the like. The light-shielding film 24 has a thickness sufficient to fully absorb the light emitted from the light-emitting function layer 54. The depth of the recess 30 is more than or equal to the thickness of the color filter 90, and the color filter 90 has a thickness sufficient to produce any one of three primary color lights from the light emitted from the organic EL element 50. The thickness of the thick portions 26 of the sealing film 22 is determined depending on the above factors.

In the organic EL device 1 of the present embodiment, the thickness of the light-shielding film 24 is 0.5 μm (500 nm). Since Cr and Ni can sufficiently block light, the light-shielding film 24 having such a thickness does not transmit light emitted from the organic EL element 50, and can prevent color mixing between the sub-pixels 46. The thickness of the thin portions 28 is about 0.4 μm. Since $SiO_n$ can form a hermetic film, the thin portions having such a thickness can sufficiently suppress the penetration of external air or the like.

The color filter 90 is made of a transparent resin, such as acrylic resin, and contains a pigment according to the color of the emitted light of the corresponding sub-pixel 46. For example, the red sub-pixel 46R has a red color filter 90R containing a material that can transmit light rays having wavelengths corresponding to red light and absorb light rays having other wavelengths. The same applies to the other color filters 90, the green color filter 90G and the blue color filter 90B.

In the organic EL device 1 of the present embodiment, the thickness of the color filters 90 is about 1.5 μm. The color filters 90 having such a thickness can produce highly pure three primary color lights from white light. In the present embodiment, the depth of the recesses 30 is set to about 1.5 μm according to the thickness of the color filters 90, and the thickness of the thick portions 26 is also determined according to these factors. Since the light-shielding film 24 has a thickness of 0.5 μm as described above, the thickness of the thick portion 26 occupies about 1.0 μm of the depth (about 1.5 μm) of the recess 30. Since the thin portion 28 has a thickness of about 0.4 μm, the thickness of the thick portion 26 of the sealing film 22, that is, the thickness of thick portion 26 from the upper surface of the cathode 56 to the top surface of the sealing film 22, is about 1.4 μm. Although the upper surface of the cathode 56 is uneven due to the presence of the underlying pixel electrodes 52, the surface roughness of the cathode is so small relative to the thickness of the sealing film 22 as not to affect the control of the thickness of the sealing film 22.

The thickness of the color filters 90 is not limited to about 1.5 μm. The thickness of the color filter 90 depends on the material of the pigment added and the emission intensity of the organic EL element 50. In general, the color filter 50 has a thickness of about 1.0 μm to about 2.0 μm. If the thickness of the thin portion 28 of the sealing film 22 is set to about 0.4 μm, the sum of the thicknesses of the thick portion 26 and the light-shielding film 24 is in the range of about 1.4 to 2.4 μm. If the thickness of the light-shielding film 24 is set to about 0.5 μm, the thickness of the thick portion 26 is in the range of about 0.9 to 1.9 μm.

A protective substrate 11 is disposed over the color filters 90 and the light-shielding film 24 with an adhesive layer 65 therebetween. The protective substrate 11 is transparent, but is not required to be resistant to heat. It can therefore be made of glass or plastic. The organic EL device 1 includes the protective substrate 11, the substrate 10, and components disposed between these substrates. A polarizer or the like may be provided over the protective substrate 11.

The organic EL device 1 of the present embodiment features the structure in which the color filters 90 are disposed over the organic EL elements 50 on the substrate 10. More specifically, the color filters 90 fill the recesses 30 formed in the sealing film 22 covering the organic EL elements 50. The recesses 30 are formed by pattering a $SiO_n$ layer 14 or another silicon compound layer over the cathode 56 by photolithography, as will be described with reference to FIGS. 4A to 4C. Therefore, the recesses 30 are formed as precisely as the pixel electrodes 52 in a locational sense. By forming the color filters 90 in the recesses 50, the misalignment between the color filters 90 and the respective organic EL elements 50 can be considerably reduced.

As with the known organic EL devices, the organic EL device 1 of the present embodiment includes a pair of substrates: the substrate 10 and the protective substrate 11 that are bonded together. However, the protective substrate 11 is merely bonded to the substrate 10 on which the pixels 45 including the color filters 90 have been formed, with the adhesive layer therebetween. Although the pair of substrates is simply bonded together, each organic EL element 50 and the corresponding color filter 90 are precisely aligned with each other.

When the degree of the misalignment between the organic EL elements 50 and the color filters 90 is constant, the percentage of the area where the pixel region (sub-pixel region 42 in the present embodiment) and the color filter 90 are properly aligned to the area of each pixel region 41 is increased as the miniaturization progresses, that is, as the pixel regions are miniaturized. Therefore, even if the organic EL elements 50 are miniaturized, the quality of displayed images cannot be enhanced unless the misalignment is reduced.

In the organic EL device 1 of the present embodiment, the areas of the driving TFT 112 and other elements driving the organic EL element 50 can be reduced because they are formed by a high-temperature process. Also, the misalignment between each organic EL element 50 and the corresponding color filter 90 is reduced by forming the color filters 90 on the substrate 10 side. Thus, the organic EL device 1 can display high-definition images from which the occurrence of color mixing has been reduced, and the quality of the displayed images is extremely enhanced.

The organic EL device 1 of the present embodiment also features the sealing film 22 made of a silicon compound $SiO_n$, and in which the recesses are formed. Since silicon compounds, such as $SiO_n$, have dense molecular structures and high sealing ability, as described above, the sealing film 22 can ensure a sufficient sealing ability even though the thin portions have a thickness as small as 0.4 μm. Accordingly, the recesses 30 can be formed at a high aspect ratio and, thus, the color filters 90 can have a sufficient thickness. Consequently, white light emitted from each light-emitting function layer 54 can be turned into any one of three primary color lights with a high color purity. The sealing film 22 thus contributes to the enhancement of the quality of displayed images.

The organic EL device 1 of the present embodiment also features the structure in which the light-shielding film 24 is provided on the substrate 10 side. More specifically, the light-shielding film 24 is formed on the upper surfaces of the thick portions 26 of the sealing film 22. Thus, the light-shielding film 24 serves as part of the side walls of the recesses 30. Consequently, the misalignment between the color filters 90 and the organic EL elements 50 is extremely reduced. Accordingly, the misalignment between the light-shielding film 24 separately surrounding the color filters 90 in plan view and the organic EL elements 50 is very small as well. Accordingly, the width of the thick portions 26, or the strips of the grid of the sealing film 22, can be reduced to increase the area ratio of the thin portions 28 to the image display region 100; hence, the proportion of the emission area can be increased.

In addition, the light-shielding film 24 is integrated with the thick portions 26 of the sealing film 22, and accordingly, the thickness of the sealing film 22 can be reduced. Also, the light-shielding film 24 can have a sufficient thickness. Accordingly, the thickness of the organic EL device 1 can be reduced without affecting the quality of displayed images. Thus low-profile electronic apparatuses can be achieved by use of the organic EL device 1.

Second Embodiment

In the second embodiment, a method for manufacturing an organic EL device that is a type of electro-optic device will now be described. FIGS. 4A to 6I are sectional views illustrating the method for manufacturing an organic EL device 2 of the present embodiment. The organic EL device 2 manufacture by the method of the present embodiment is of a top emission type that can display color images and has the same structure as the organic EL device 1 of the first embodiment. The components constituting the organic EL device are the same as those in the first embodiment. The same parts are designated by the same reference numerals and the same description may be omitted.

The method of the present embodiment features the operation performed after the organic EL elements 50 (see FIG. 3) have been formed. In the present embodiment, the description of the operations up to the formation of the organic EL elements 50 is omitted. The components and elements in the element layer 12 (see FIG. 3) are not shown in FIG. 4A to FIG. 6I. Hence, the element layer 12 is illustrated as a single layer.

Figure 4A:
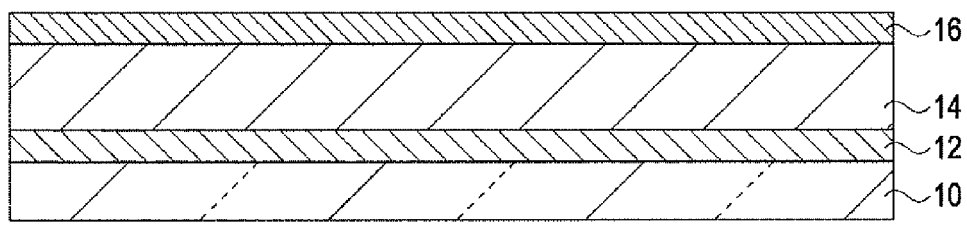
FIGS. 4A to 4C are sectional views illustrating a method for manufacturing an organic EL device in a second embodiment of the invention.

FIG. 4A shows a state after forming an element layer 12 including organic EL elements 50 on the substrate 10, forming a $SiO_n$ layer 14, which is a type of silicon compound layer, on the element layer 12, and further forming a Cr (chromium) layer 16 acting as s light-shielding film on the $SiO_n$ layer 14. The element layer 12 includes a plurality of light-emitting elements or organic EL elements 50 regularly arranged in a matrix manner in plan view. Thus, the element layer 12 is formed first. In this operation, the image display region 100 (see FIG. 1) is formed. Subsequently, the $SiO_n$ layer 14 is formed, and then the Cr layer 16 is formed. In the present embodiment, the $SiO_n$ layer 14 is formed to a thickness of about 1.4 μm, and the Cr layer is formed to a thickness of about 0.5 μm. The reason why these layers have such thicknesses has been described in the first embodiment. Instead of the Cr layer 16, a Ni (nickel) layer may be formed as the light-shielding film. Instead of the $SiO_n$ layer 14, a $SiN_n$ layer or a $SiO_mN_n$ layer may be used as the silicon compound layer.

After the formation of the $SiO_n$ layer 14 and the Cr layer 16, the $SiO_n$ layer 14 is locally etched to a predetermined depth to form thin portions 28 (see FIG. 3). The unetched portions of the $SiO_n$ layer 14, where the initial thickness is maintained, are defined as the thick portions 26 (see FIG. 3). Thus a sealing film 22 is formed by forming the thin portions 28 and the thick portions 26 in the $SiO_n$ layer 14. The thick portions 26 define strips of the grid separately surrounding the thin portions 28 formed in a matrix manner with a distance therebetween. By forming the thin portions 28 and the thick portions 26, recesses 30 (see FIG. 3) are formed. The recesses 30 are thus formed by etching.

As shown in FIG. 3, the organic EL element 50 includes the pixel electrode 52, the light-emitting function layer 54 and the cathode 56. Since the light-emitting function layer 54 and the cathode 56 are disposed throughout the entire image display region 100 (see FIG. 1), the regions corresponding to the pixel electrodes 52 when viewed from above act as the organic EL elements 50. In the organic EL device 2 manufactured in the present embodiment, a reflection layer 63 is disposed under each pixel electrode 52, as shown in FIG. 3. The light emitted from the light-emitting function layer 54 and transmitted toward the substrate 10 is reflected upward from the reflection layer. Therefore, the $SiO_n$ layer 14 is etched so that the thin portions 28 are formed so as to be aligned with the reflection layers 63. In this instance, the thin portions 28 may be formed so as to overlie the respective reflection layers 63, or so as to be surrounded by ring-shaped overlap portions of the thick portions 26 and the reflection layers 63.

Figure 4B:
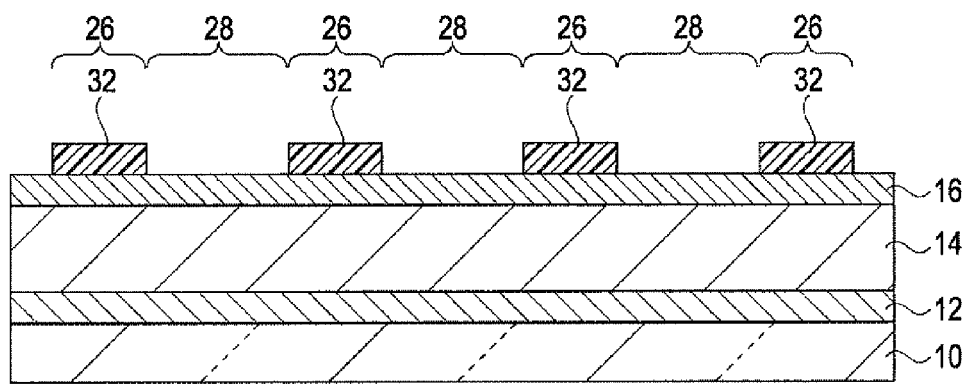
Figure 4C:
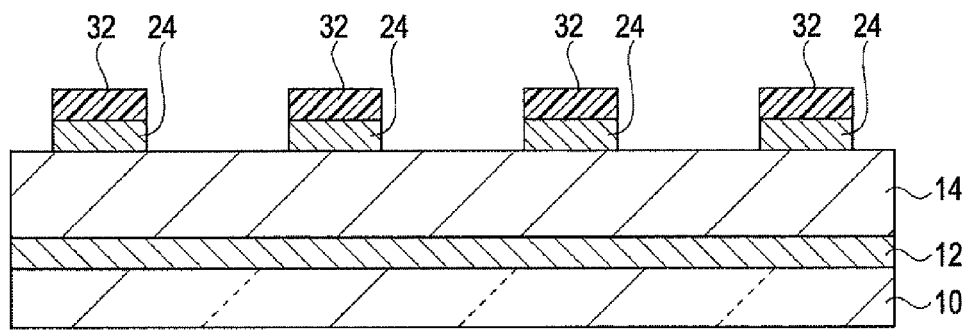

The recesses 30 are formed as below. First, a resist pattern 32 is formed in regions where the thick portions 26 will be formed, as shown in FIG. 4B, by patterning a resist layer (no reference numeral) formed over the entire surface of the Cr layer 16 by light exposure and development. Then, the Cr layer 16 is patterned into a light-shielding film 24 by etching using the resist pattern 32 as a mask, as shown in FIG. 4C.

Figure 5D:
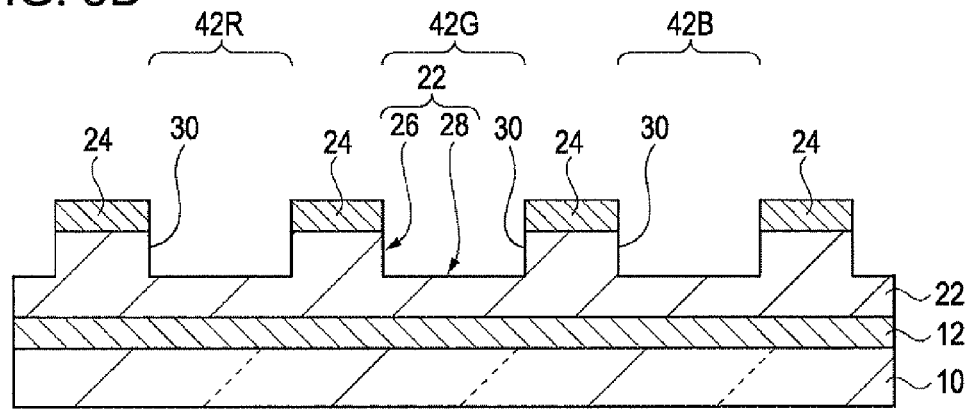
FIGS. 5D to 5F are sectional views illustrating the method for manufacturing the organic EL device in the second embodiment of the invention.

Subsequently, the $SiO_n$ film 14 is etched to a predetermined depth through the resist pattern 32 and the light-shielding film 24, thereby forming the thin portions 28 and the thick portions 26, as shown in FIG. 5D. The thin portions 28 and the thick portions 26 form the recesses 30. In the present embodiment, the "predetermined depth" is set at about 1.0 μm. Since the $SiO_n$ film 14 has a thickness of about 1.4 μm, the thin portion 28 is defined by a $SiO_n$ film 14 having a thickness of about 0.4 μm (400 nm) formed on the surface of the element layer 12 by etching to such a depth. Since the $SiO_n$ film 14 has a dense structure as mentioned above, the thin portions 28 of 0.4 μm in thickness can ensure sufficient sealing.

The recesses 30 correspond to the sub-pixel regions 42 (see FIG. 2) where the sub-pixels 46 will be formed. As shown in FIGS. 2 and 5D, the sub-pixel regions 42 include regularly arranged three primary color sub-pixel regions: red sub-pixel regions 42R; green sub-pixel regions 42G; and blue sub-pixel regions 42B. The light-shielding film 24 (Cr layer 16) has a thickness of about 0.5 μm as described above. When the $SiO_n$ film 14 is dug to a depth of about 1.0 μm by etching, the depth of the recesses 30 comes to about 1.5 μm in total, together with the thickness of 0.5 μm of the light-shielding film 24.

Figure 5E:
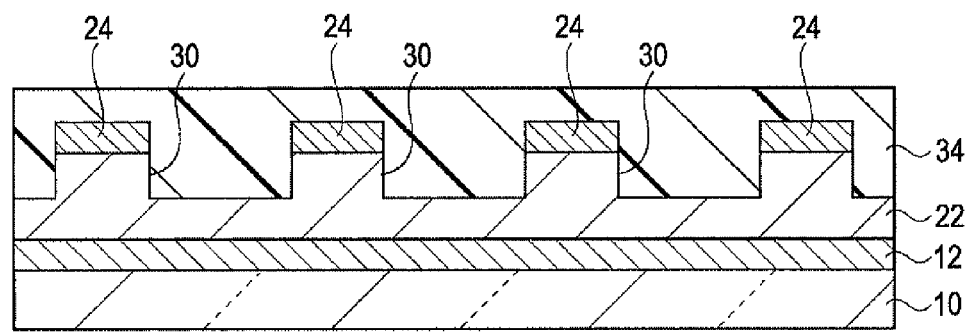

Subsequently, color filters 90 are formed in the recesses 30. As shown in FIG. 5E, a photosensitive acrylic resin layers 34 containing a red pigment are formed over the entire surface of the substrate 10 on which the sealing film 22 and the light-shielding film 24 have been formed. The red pigment can transmit light rays having wavelengths of red light and absorb light rays having other wavelengths. The acrylic resin layer 34 can be formed by, for example, spin coating.

Figure 5F:
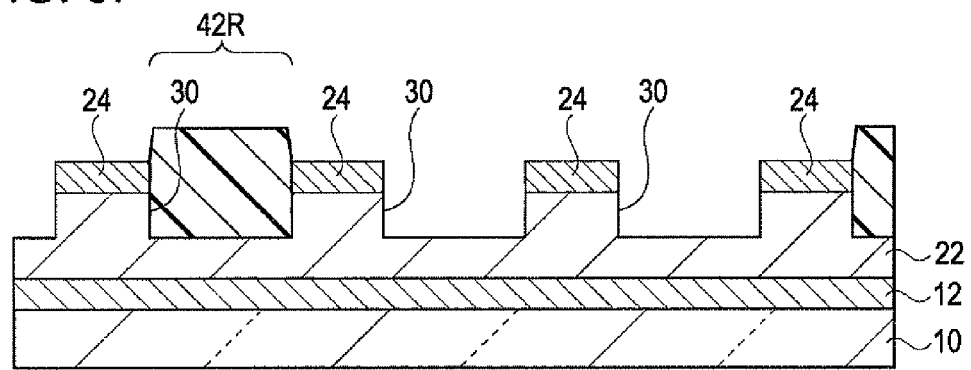
Figure 6G:
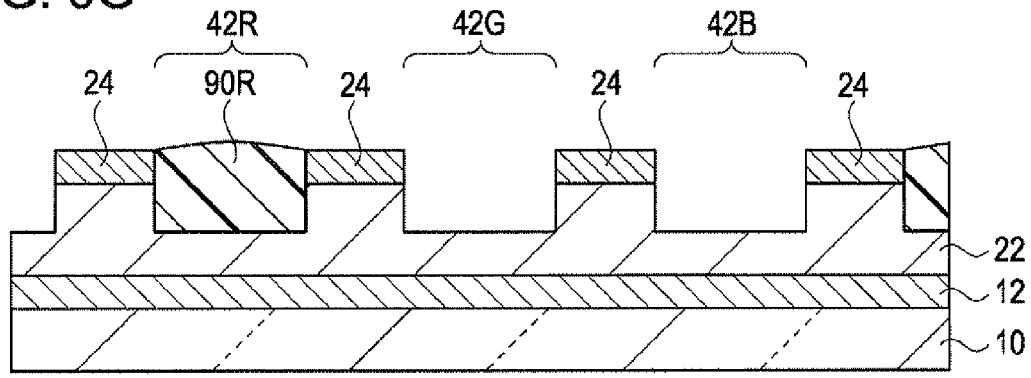
FIGS. 6G to 6I are sectional views illustrating the method for manufacturing the organic EL device in the second embodiment of the invention.
Figure 6H:
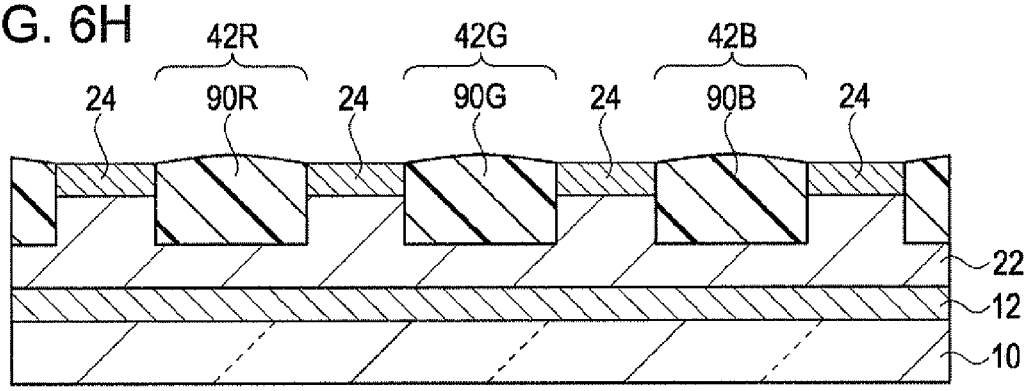

The acrylic resin layer 34 is subjected to light exposure and development so as to be removed except the portions in the red sub-pixel region 42R, as shown in FIG. 5F. Then, as shown in FIG. 6G, the remaining portions of the acrylic resin layer 34 in the red sub-pixel regions 42R are baked to be cured. The red color filters 90R are thus formed in the red sub-pixel regions 42R. Green color filters 90G and blue color filters 90B are also formed in the green sub-pixel regions 42G and the blue sub-pixel regions 42B, respectively, in the same manner as shown in FIG. 6H.

Figure 6I:
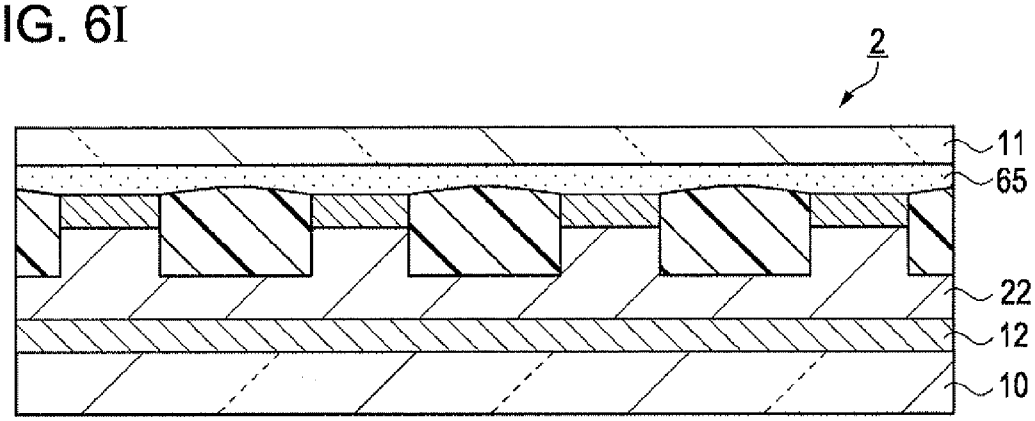

Finally, a protective substrate 11 is bonded with adhesive layer 65 to protect the color filters 90, as shown in FIG. 6I. Thus the organic EL device 2 is completed through the above operations. The protective substrate 11 is required to be transparent, but is not required to be resistant to heat. Therefore, quartz glass or normal glass can be used as the protective substrate. If flexibility is required, the protective substrate 11 may be made of a plastic.

One of the features of the method of the present embodiment is that the alignment between the organic EL elements 50 and the color filters 90 can be performed by photolithography, but not by bonding the substrates together. Since the color filters 90 are formed in the recesses 30 that have been formed by photolithography in the $SiO_n$ layer 14 formed over the organic EL elements 50, the bonding of the protective substrate 11 does not affect the positional precision (relative accuracy) of the alignment between the organic EL elements 50 and the color filters 90. In addition, photolithography, in general, results in higher precision in alignment than the bonding of the substrates together. Accordingly, in the organic EL device 2 produced by the method of the present embodiment, misalignment between the organic EL elements 50 and the color filters 90 is reduced relative to the misalignment caused in the known organic EL device. Thus, the organic EL elements 50 can be miniaturized, and accordingly a high-definition organic EL device can be achieved.

In addition, since the light-shielding film 24 can be used as a mask for patterning the $SiO_n$ film 14 to form the recesses 30, the misalignment between the light-shielding film 24 and the recesses 30 can be reduced. Consequently, the percentage of the light-shielding film 24 occupying the area of the image display region 100 is reduced, and thus a still more high-definition organic EL device can be achieved.

In the method of the present embodiment, the light-shielding film 24 is used as part of the side walls of the recesses 30 so that the recesses 30 have a sufficient depth. As described above, in the organic EL device 2 produced by the method of the present embodiment, the recesses 30 have a depth of about 1.5 μm. Accordingly, the color filters 90 can have a sufficient thickness without increasing the thickness of the sealing film 22. Thus, the resulting organic EL device can emit light with a higher color purity, that is, can display more high-quality images.

Electronic Apparatus

Figure 7:
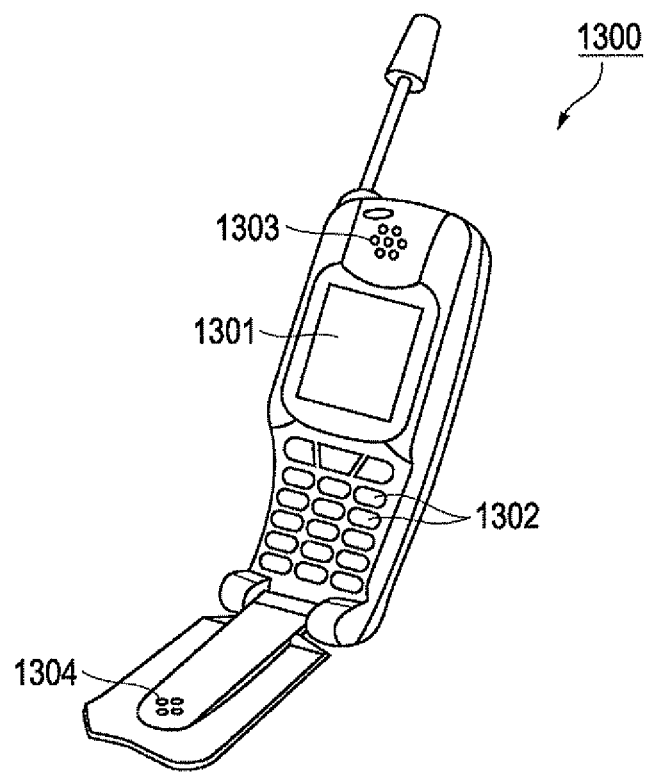
FIG. 7 is a perspective view of a cellular phone as an electronic apparatus according to an embodiment of the invention.

FIG. 7 is a perspective view of a cellular phone 1300 that is an electronic apparatus including the organic EL device 1 of the first embodiment or the organic EL device 2 manufactured by the method of the second embodiment. The cellular phone 1300 includes a display portion 1301, a plurality of control buttons 1302, a receiver 1303, and a microphone 1304. The display portion 1301 includes the organic EL device 1 or 2.

As described above, in the image display region 100 (see FIG. 1) of the organic EL device 1 or 2, the organic EL elements 50 are closely arranged. The sufficiently thick color filters 90 are also arranged corresponding to the respective organic EL elements 50 with misalignment reduced. Although the color filters 90 have a sufficient thickness, the total thickness of the organic EL device is not increased. Accordingly, the cellular phone 1300 including the organic EL device 1 or 2 can display high-definition images with high color purity while the increase in weight and dimensions is restricted.

Various modifications may be made in the embodiments of the invention. Exemplary modifications will be described below.

Modification 1

In the organic EL devices 1 and 2, each sub-pixel region 42 has a 14 μm by 4 μm rectangular shape, and the sub-pixel regions 42R, 42G and 42B are arranged in a striped manner.

However, the sub-pixel regions 42 may each have an almost square shape, and may be arranged in a staggered manner.

Modification 2

In the organic EL devices 1 and 2, the sealing film 22 is formed by locally etching a single $SiO_n$ layer 14. However, the sealing film 22 may be formed by depositing a plurality of material layers. For example, a buffer layer of an organic material may be formed over the element layer 12 to enhance the resistance to impact. A plurality of silicon compound layers may be formed.

The entire disclosure of Japanese Patent Application No. 2010-117043, filed May 21, 2010 is expressly incorporated by reference herein.

What is claimed is:

1. An electro-optical device comprising:
   a first substrate;
   a second substrate opposite to the first substrate;
   a light-emitting element that is disposed above the first substrate;
   a sealing film that is disposed over the light-emitting element and is composed of an inorganic material, the sealing film having an optically transparent property;
   a color filter that is disposed on the sealing film;
   a light-shielding film that is disposed on the sealing film; and
   an adhesive layer that is disposed over the color filter and the light-shielding film, the adhesive layer disposed between the color filter and the second substrate and between the light-shielding film and the second substrate in plan view,
   the sealing film having at least one recess which overlaps the light-emitting element in plan view,
   the color filter being disposed in the at least one recess, and the light-shielding film not being disposed in the at least one recess.

2. The electro-optical device according to claim 1, wherein the sealing film is made of an inorganic material.

3. The electro-optical device according to claim 2, wherein the inorganic material is a silicon compound.

4. The electro-optical device as set forth in claim 3, wherein the electro-optical device is included within an electronic apparatus.

5. The electro-optical device as set forth in claim 2, wherein the electro-optical device is included within an electronic apparatus.

6. The electro-optical device according to claim 1, wherein the light-shielding film is made of Cr or Ni.

7. The electro-optical device as set forth in claim 6, wherein the electro-optical device is included within an electronic apparatus.

8. The electro-optical device according to claim 1, wherein the light-shielding film has a thickness smaller than the depth of the at least one recess.

9. The electro-optical device as set forth in claim 8, wherein the electro-optical device is included within an electronic apparatus.

10. The electro-optical device according to claim 1, wherein the light-emitting element includes a first electrode, a second electrode, and a luminescent layer which is disposed between the first electrode and the second electrode, wherein the luminescent layer is configured to emit a white color.

11. The electro-optical device according to claim 10, wherein the color filter is configured to transmit a light emitting from the luminescent layer.

12. The electro-optical device as set forth in claim 1, wherein the electro-optical device is included within an electronic apparatus.

13. The electro-optical device according to claim 1, wherein the light-emitting element includes
   a first electrode,
   a second electrode, and
   a luminescent layer having a first portion and a second portion, the first portion being disposed between the first electrode and the second electrode,
   wherein the first portion of the luminescent layer overlaps the color filter and the second portion of the luminescent layer overlaps the light-shielding film in plan view.

14. An electro-optical device comprising:
   a first substrate;
   a second substrate opposite to the first substrate;
   a light-emitting element that is disposed above the first substrate;
   a sealing film that is disposed above the light emitting element and has an optically transparent property, the sealing film including a first region that overlaps the light-emitting element and a second region that is different from the first region, the thickness of the sealing film in the first region being smaller than the thickness of the sealing film in the second region;
   a color filter that is disposed on the sealing film in the first region;
   a light-shielding film that is disposed on the sealing film in the second region, the light-shielding film not overlapping the sealing film in the first region; and
   an adhesive layer that is disposed over the color filter and the light-shielding film, the adhesive layer disposed between the color filter and the second substrate and between the light-shielding film and the second substrate in plan view.

15. An electro-optical device comprising:
   a first substrate;
   a second substrate opposite to the substrate;
   a light-emitting element that is disposed above the first substrate;
   a sealing film that is disposed above the light-emitting element and has an optically transparent property, the sealing film including a first region that overlaps the light-emitting element and a second region that is different from the first region, the thickness of the sealing film in the first region being smaller than the thickness of the sealing film in the second region;
   a color filter that is disposed on the sealing film in the first region;
   a light-shielding film that is disposed on the sealing film in the second region;
   and
   an adhesive layer that is disposed over the color filter and the light-shielding film, the adhesive layer disposed between the color filter and the second substrate and between the light-shielding film and the second substrate in plan view.

* * * * *